US007858500B2

(12) United States Patent
Cartier et al.

(10) Patent No.: US 7,858,500 B2
(45) Date of Patent: Dec. 28, 2010

(54) LOW THRESHOLD VOLTAGE SEMICONDUCTOR DEVICE WITH DUAL THRESHOLD VOLTAGE CONTROL MEANS

(75) Inventors: Eduard A. Cartier, New York, NY (US); Matthew W. Copel, Yorktown Heights, NY (US); Martin M. Frank, Bronx, NY (US); Evgeni P. Gousev, Saratoga, CA (US); Paul C. Jamison, Hopewell Junction, NY (US); Rajarao Jammy, Austin, TX (US); Barry P. Linder, Hastings-on-Hudson, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 12/062,972

(22) Filed: Apr. 4, 2008

(65) Prior Publication Data

US 2008/0182389 A1    Jul. 31, 2008

Related U.S. Application Data

(62) Division of application No. 11/259,644, filed on Oct. 26, 2005.

(51) Int. Cl.
   *H01L 21/479* (2006.01)
(52) U.S. Cl. ...................................... 438/466

(58) Field of Classification Search ..................
   257/E21.431–E21.435, E21.619–E21.62,
   257/411, 406, 410, 405, 616, E27.015–E27.017,
   257/E27.03–E27.032, E27.109, E29.194–E29.225,
   257/E21.382–E21.385, E21.695–E21.696,
   257/613–615, E29.325–E29.346, 324, E29.132–E29.138,
   257/E29.162–E29.165, E21.625–E21.639,
   257/288, 401, 901, E29.148–E29.149, E29.265;
   257/E29.32, E39.013, E29.322, E49.003,
   257/E21.404, E21.408; 438/466, 3, 240,
   438/216, 519, 261, 288, 202–208, 234–239,
   438/37, 41, 44, 46, 47, 84–87, 93–95, 102–105,
   438/478–509, 607, 647, 263, 264, 287, 585–596,
   438/785–794
   See application file for complete search history.

(56) References Cited

U.S. PATENT DOCUMENTS 5,763,922 A * 6/1998 Chau ........................ 257/371
(Continued)

FOREIGN PATENT DOCUMENTS

DE    10 2004 048 679    5/2005
(Continued)

OTHER PUBLICATIONS

Hobbs, et al., "Factors Influencing the Threshold Voltages of Metal Oxide CMOS Devices", Technology Solutions Group, Motorola, ECS2004.
(Continued)

*Primary Examiner*—Dao H Nguyen
*Assistant Examiner*—Tram H Nguyen
(74) *Attorney, Agent, or Firm*—Scully, Scott, Murphy & Presser, P.C.; Louis J. Percello, Esq.

(57) ABSTRACT

A semiconductor structure, particularly a pFET, which includes a dielectric material that has a dielectric constant of greater than that of $SiO_2$ and a Ge or Si content of greater than 50% and at least one other means for threshold/flatband voltage tuning by material stack engineering is provided. The other means contemplated in the present invention include, for example, utilizing an insulating interlayer atop the dielectric for charge fixing and/or by forming an engineered channel region. The present invention also relates to a method of fabricating such a CMOS structure.

20 Claims, 3 Drawing Sheets

U.S. PATENT DOCUMENTS

| | | | |
|---|---|---|---|
| 2001/0032995 | A1 | 10/2001 | Maria et al. |
| 2003/0042557 | A1 | 3/2003 | Shimamoto et al. |
| 2003/0067021 | A1 | 4/2003 | Ikeda et al. |
| 2004/0188762 | A1 | 9/2004 | Shimamoto et al. |
| 2005/0045938 | A1* | 3/2005 | Mutou et al. ............. 257/310 |
| 2005/0151184 | A1 | 7/2005 | Lee et al. |
| 2005/0253181 | A1* | 11/2005 | Kimizuka et al. .......... 257/310 |
| 2005/0280104 | A1 | 12/2005 | Li |
| 2006/0223248 | A1 | 10/2006 | Venugopal et al. |

OTHER PUBLICATIONS

Deweerd, et al., "Potential remedies for the VT/Vrb-shift problem of Hf/polysilicon-based gate stacks: a solution-based survey", Elsevier, Microelectronics Reliability 45 (2005), pp. 786-789.

Hobbs, et al., "Fermi Level Pinning at the PolySi/Metal Oxide Interface", 2003 Symposium on VLSI Technology Digest of Technical Papers, 4-89114-035-6/03.

Hobbs, et al., "Fermi-Level Pinning at the Polysilicon/Metal Oxide Interface-Part I", IEEE Transactions of Electron Devices, vol. 51, No. 6, Jun. 2004, pp. 971-977.

Lee, et al., "Optimized poly-Si/HfSiO low power devices with ideal threshold voltage and mobility", IBM Semiconductor Research and Development Center.

Miyamura, et al., "Origin of Flatband Voltage Shift in Poly-Si/Hf-based High-k Gate Dielectrics and Vfb Dependence on Gate Stack Structure", System Devices Research Laboratories, NEC Corp.

Cartier, et al., Systematic study of pFET Vt with Hf-based gate stacks with poly-Si and FUSI gates, 2004 Symposium on VLSI Technology Digest of Technical Papers, pp. 44-45.

Punchaipeth, P., et al. "Effect of Nitrogen on Electrical and Physical Properties of Polyatomic Layer Chemical Vapor Deposition Hfsichioy Gate Dielectrics", Japanese Journal of Applied Sciences, Japany Society of Applied Physics, Tokyo, JP, vol. 43, No. 11B, Nov. 1, 2004, pp. 7815-7820.

Iwamoto, T., et al., "A Highly Manufacturable Low Power and High Speed HfSiO CMOS FET with Dual Poly-Si Gate Electrodes", International Electron Devices Meeting, 2003, New York, NY.

* cited by examiner

LOW THRESHOLD VOLTAGE SEMICONDUCTOR DEVICE WITH DUAL THRESHOLD VOLTAGE CONTROL MEANS

RELATED APPLICATIONS

This application is a divisional of U.S. patent application Ser. No. 11/259,644, filed Oct. 26, 2005.

FIELD OF THE INVENTION

The present invention relates to a semiconductor structure, and more particularly to a complementary metal oxide semiconductor (CMOS) structure, particularly a pFET, which includes a dielectric material that has a dielectric constant of greater than that of $SiO_2$ and a Ge or Si content of greater than 50% and at least one other means for threshold/flatband voltage tuning by material stack engineering. The other means contemplated in the present invention include, for example, utilizing an insulating interlayer atop the dielectric for charge fixing and/or by forming an engineered channel region. The present invention also relates to a method of fabricating such a semiconductor structure

BACKGROUND OF THE INVENTION

In standard silicon complementary metal oxide semiconductor (CMOS) technology, p-type field effect transistors (pFET) use a boron (or other acceptor) doped p-type polysilicon layer as a gate electrode that is deposited on top of a silicon dioxide or silicon oxynitride gate dielectric layer. The gate voltage is applied through this polysilicon layer to create an inversion channel in the n-type silicon underneath the gate dielectric layer.

For a pFET to work properly, the inversion should begin occurring at slightly negative voltages applied to the polysilicon (poly-Si) gate electrode. This occurs as a consequence of the band alignment for the gate stack structure as depicted in FIG. 1. Specifically, FIG. 1 shows the approximate band alignment across a poly-Si/gate oxide gate stack in a typical pFET at zero gate bias. In FIG. 1, $E_c$, $E_v$ and $E_f$ are the conduction band edge, valence band edge and the Fermi level in the silicon, respectively. The poly-Si/gate oxide/n-type silicon stack forms a capacitor that swings into inversion at around 0 V and into accumulation around +1 V (depending on the substrate doping). The threshold voltage Vt, which can be interpreted as the voltage at which the inversion starts occurring, is therefore approximately 0 V and the flatband voltage, which is the voltage just beyond which the capacitor starts to swing into accumulation, is approximately +1 V. The exact values of the threshold and flatband voltages have a dependence on the doping level in the silicon substrate, and can be varied somewhat by choosing an appropriate substrate doping level.

In future technology, silicon dioxide or silicon oxynitride dielectrics will be replaced with a gate material that has a higher dielectric constant. These materials are known as "high k" materials with the term "high k" denoting an insulating material whose dielectric constant is greater than 4.0, preferably greater than about 7.0. The dielectric constants mentioned herein are relative to a vacuum unless otherwise specified. Of the various possibilities, hafnium oxide, hafnium silicate, or hafnium silicon oxynitride may be the most suitable replacement candidates for conventional gate dielectrics due to their excellent thermal stability at high temperatures.

Unfortunately, when p-type field effect transistors are fabricated using a dielectric such as hafnium oxide or hafnium silicate, it is a well known problem that the flatband voltage of the device is shifted from its ideal position of close to about +1 V, to about 0+/−300 mV. This shift in flatband voltage is published in C. Hobbs et al., entitled "Fermi Level Pinning at the Poly-Si/Metal Oxide Interface", 2003 Symposium on VLSI Technology Digest of Technical Papers. Consequently, the threshold voltage of the device is shifted to approximately −1 V. This threshold voltage shift is believed to be a consequence of an intimate interaction between the Hf-based gate oxide layer and the polysilicon layer. One model (See, for example, C. Hobbs, et al., ibid.) speculates that such an interaction causes an increase in the density of states in the silicon band gap at the polysilicon-gate oxide interface, leading to "Fermi level pinning". Alternatively, oxygen vacancies in the high k dielectric may cause fixed charge, moving the threshold voltage. The threshold voltage therefore is not in the "right" place, i.e., it is too high for a useable CMOS (complementary metal oxide semiconductor) technology.

One possible solution to the above problem of threshold voltage shifting is by substrate engineering in which channel implants can be used to shift thresholds. Although substrate engineering is one possible means to stabilize threshold voltage shift, it can do so to a limited extent, which is inadequate for FETs, particularly pFETs, that include a gate stack comprising a poly-Si gate electrode and a hafnium-containing high dielectric constant gate dielectric.

Another possible solution to the problem of threshold voltage shifting mentioned above is by providing an insulating interlayer between the conductive material and dielectric material such as is described, for example, in co-pending and co-assigned in U.S. Ser. No. 10/845,719, filed May 14, 2004, U.S. Ser. No. 10/863,830, filed Jun. 4, 2004, and U.S. Ser. No. 11/035,889, filed Jan. 14, 2005. The entire contents of each of the aforementioned U.S. patent applications are incorporated herein by reference in their entirety.

A yet other possible solution to the above problem of threshold voltage shifting is to increase the Si content of the dielectric material. This solution has been described by E. Cartier, et al., entitled "Systematic study of pFET $V_t$ with Hf-based stacks with poly-Si and FUSI gates", 2004 Symposium on VLSI Technology Digest of Technical Papers, 2004 IEEE, pp. 44-45; C. Hobbs, et al., entitled "Factors Influencing the Threshold Voltages of Metal Oxide CMOS Devices", ECS2004; W. Deweerd, et al., entitled "Potential remedies for the $V_T/V_{fb}$-Shift problem of Hf/polysilicon-based gate stacks: a solution-based survey", Microelectronics Reliability 25, (2205), pp. 786-789; C. Hobbs, et al., entitled "Fermi Level Pinning at the PolySi/Metal oxide Interface", 2003 Symposium on VLSI Technology Digest of Technical Papers, 2003 IEEE; and C. Hobbs, et al., entitled "Fermi-Level Pinning at the Polysilicon/Metal Oxide Interface-Part I", IEEE Transactions on Electron Devices, Vol. 51, No. 6, Jun. 2004, pp. 971-977.

Although the various techniques alone have been used to improve the problem of threshold voltage shifting, further improvement is still needed. For example, the use of an insulating interlayer such as Al(O)N deposited onto a $HfO_2$ and a low Si content HfSiO (Si content of lower than 50%) dielectric has provided $V_t$ improvement by up to 0.35 V. Additional measures are needed that can bridge the remaining cap to provide a total of 0.6 V; the total magnitude $V_t$ observed for gate stack including polySi and $HfO_2$ or a low Si constant HfSiO. Similar measures are also needed when high Si content dielectrics are used alone. Implant channel engineering can also move the threshold voltage, but may cause performance degradation and/or enhanced short channel effects.

To date, the prior art utilizes only a single means to reduce the threshold voltage shift described above. The applicants of the present invention have determined that by combining a high k dielectric with a high Si or Ge content with an insulating interlayer and/or by channel engineering, the shift in threshold and flatband voltages are almost eliminated.

SUMMARY OF THE INVENTION

As stated above, the present invention solves the threshold and flatband voltage variation by combining a high k dielectric that has a Si or Ge content that is greater than 50% with at least one other means for threshold/flatband voltage tuning by material stack engineering. The other means contemplated in the present invention include, for example, utilizing an insulating interlayer atop the dielectric for charge fixing and/or by forming an engineered channel region. The term "high k dielectric" is used throughout the present application to denote a dielectric material having a dielectric constant that is greater than that of $SiO_2$. That is, the high k dielectrics employed in the present invention, in addition to requiring a high Si or Ge content, have a dielectric constant of greater than 4.0; all dielectric constants reported herein are relative to a vacuum unless otherwise stated.

In general terms, the present invention provides a semiconductor structure which includes:

a semiconductor substrate having source and drain diffusion regions located therein;

a gate stack located on top of the semiconductor substrate, said gate stack comprising a high k gate dielectric having a Si or Ge content of greater than 50% and a silicon (Si)- or germanium (Ge)-containing gate conductor; and at least one element comprising an insulating interlayer located between said high k gate dielectric and said Si- or Ge-containing gate conductor, an engineered device channel located between the source and drain diffusion regions, or a combination thereof; wherein said high k gate dielectric and said at least one element stabilize the gate stack's threshold/flatband voltage to a targeted value.

In one highly preferred embodiment of the present invention, a semiconductor structure is provided that includes a semiconductor substrate having source and drain diffusion regions located therein, said source and drain diffusion regions are separated by a device channel; and a gate stack located on top of said device channel, said gate stack comprising a high k gate dielectric having a Si or Ge content of greater than 50%, an insulating interlayer and a Si- or Ge-containing gate conductor, said insulating interlayer is located between said high k gate dielectric and said Si-containing gate conductor and both said high k gate dielectric and said insulating interlayer stabilize the gate stack's threshold/flatband voltage to a targeted value.

In the various embodiments described above, the high k gate dielectric is typically, but is not limited to: a Hf-based gate dielectric such as HfSiO, HfSiON, HfGeO, or HfGeON.

In another aspect of the present invention, a method of forming a semiconductor structure having improved threshold voltage and flatband voltage stability is provided. The method includes the steps of:

providing a structure on a semiconductor substrate, said structure comprising a gate stack including a high k gate dielectric having a Si or Ge content of greater than 50% and a Si- or Ge-containing gate conductor, and at least one element comprising an insulating interlayer located between said high k gate dielectric and said Si- or Ge-containing gate conductor, an engineered device channel, or a combination thereof; and applying a bias by known means to said gate stack.

DETAILED DESCRIPTION OF THE INVENTION

Figure 1:
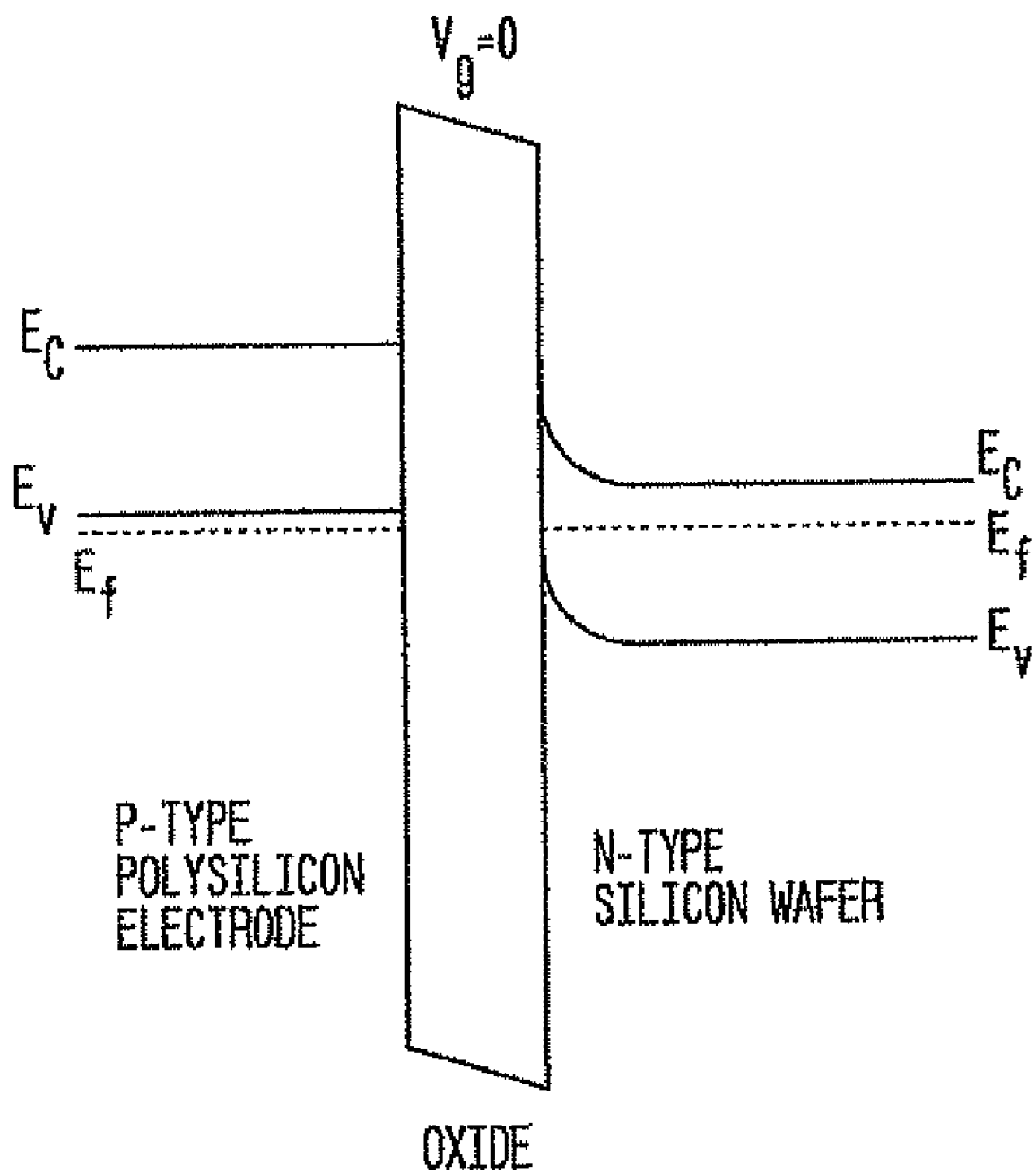
FIG. 1 is a schematic showing approximate band alignment across a prior art gate stack in a typical pFET at zero gate bias, $V_g=0$ V. The quantities $E_c$ and $E_v$ denote the conduction and the valence band edge, respectively, in the silicon substrate and in the polysilicon gate. $E_f$ denotes the Fermi level position (dotted line) in the silicon substrate and in the polysilicon gate at zero gate bias.

The present invention, which provides a semiconductor structure, such as a FET, with low threshold voltage and flatband shifts as well as a method of fabricating the same, will now be described in greater detail in the discussion that follows. It is noted that in the following discussion reference will be made to certain drawings that are provided for illustrative purposes. Since the drawings are provided for illustrative purposes, they are not drawn to scale.

It is emphasized that the present invention provides threshold voltage control for semiconductor devices, especially pFETs, by utilizing a dielectric having a high k dielectric and a high content of Si or Ge (greater than 50%) and at least one other means for tuning the threshold voltage such as, for example, incorporating an insulating interlayer between the dielectric and the overlying conductor or by channel engineering (i.e., counterdoping and/or halo doping tuning). In the following description, a FET is described and illustrated. Although such a description is made, the present invention also contemplates that the same basic processing steps and materials can be used in forming other semiconductor structures such as capacitors.

In a first embodiment of the present invention, threshold voltage control is achieved by utilizing a high k dielectric with a high content of Si or Ge and an insulating interlayer. This embodiment of the present invention begins by first providing the layered structure shown in FIG. 2A. As shown, the structure includes semiconductor substrate 12, an optional native oxide layer 14 located on a surface of the semiconductor substrate 12, a high k dielectric 20 having a Si or Ge content of greater than 50% located either on a surface of the optional native oxide layer 14, if present, or on a surface of the semiconductor substrate 12 if the optional native oxide layer 14 is not present, an insulating interlayer 22 located on the dielectric 20 and a Si- or Ge-containing conductor 24 located on the insulating interlayer 22. The term 'native oxide' is used herein to denote any oxide, nitride, or oxynitride material predominantly containing cations of a type that is contained in the semiconductor substrate 12.

Figure 2A:
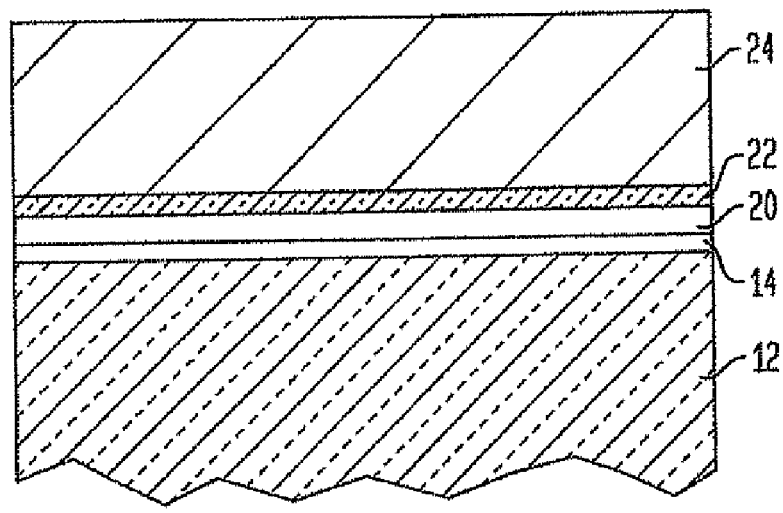
FIGS. 2A-2B are pictorial representations (through a cross sectional views) of the inventive semiconductor structure that includes a threshold voltage stabilization interlayer located between a high k dielectric with a high content of Si or Ge and a poly-Si or poly-Ge electrode at different processing steps of the present invention; prior to patterning FIG. 2A and after patterning FIG. 2B.

The structure shown in FIG. 2A is made by first providing blanket layers of the optional native oxide layer 14, the dielectric 20, the insulating interlayer 22 and the Si- or Ge-containing gate conductor 24 on a surface of the semiconductor substrate 12. In accordance with this embodiment of present invention, the insulating interlayer 22 is located between the high k dielectric 20 and the Si- or Ge-containing conductor 24.

The semiconductor substrate 12 employed in the present invention comprises any semiconducting material including, but not limited to: Si, Ge, SiGe, SiC, SiGeC, Ga, GaAs, InAs, InP and all other III/V or II/VI compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

The semiconductor substrate 12 may also include a first doped (n- or p-) region, and a second doped (n- or p-) region. For clarity, the doped regions are not specifically shown in the drawing of the present application. The first doped region and the second doped region may be the same, or they may have different conductivities and/or doping concentrations. These doped regions are known as "wells".

At least one isolation region (not shown) is then typically formed into the semiconductor substrate 12. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities. The neighboring gate regions can have the same conductivity (i.e., both n- or p-type), or alternatively they can have different conductivities (i.e., one n-type and the other p-type).

After processing the semiconductor substrate 12, an optional native oxide layer 14 is optionally formed on the surface of the semiconductor substrate 12. The optional native oxide layer 14 is formed utilizing a conventional growing technique that is well known to those skilled in the art including, for example, oxidation or oxynitridation. When the substrate 12 is a Si-containing semiconductor, the native oxide layer 14 is comprised of silicon oxide, silicon oxynitride or a nitrided silicon oxide. The thickness of the native oxide layer 14 is typically from about 0.1 to about 1.2 nm, with a thickness from about 0.5 to about 1 nm being more typical. The thickness, however, may be different after processing at higher temperatures, which are usually required during CMOS fabrication.

Next, a high k dielectric 20 having a Si or Ge content of greater than 50% (hereinafter "dielectric 20") is formed on a surface of the structure. The dielectric 20, which may serve as a gate dielectric of a FET or a dielectric between two capacitor electrodes, can be formed by a thermal growth process such as, for example, oxidation, nitridation or oxynitridation. Alternatively, the dielectric 20 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The dielectric 20 may also be formed utilizing any combination of the above processes.

The dielectric 20 is comprised of an insulating material having a dielectric constant of greater than about 4.0 (i.e., the dielectric constant of $SiO_2$), preferably greater than 7.0 and a Si or Ge content of greater than 50%, preferably from about 60 to about 90%. Specifically, the gate dielectric 20 employed in the present invention includes, but not limited to: a silicate including metal silicates and nitrided metal silicates or a germanate including metal germanates and nitrided metal germanates. These dielectrics may optionally include at least one of Al or N. In one embodiment, it is preferred that the dielectric 20 is comprised of a Hf-based (i.e., containing) dielectric such as HfSiO.

The physical thickness of the dielectric 20 may vary, but typically, the dielectric 20 has a thickness from about 0.5 to about 10 nm, with a thickness from about 0.5 to about 3 nm being more typical.

Next, insulating interlayer 22 is formed atop the blanket layer of dielectric 20. The insulating interlayer 22 employed in the present invention has at least one of the following characteristics: (i) it is capable of preventing interaction between the dielectric 20 and the Si- or Ge-containing conductor 24 by spatial separation; (ii) it has a sufficiently high dielectric constant (on the order of about 4.0 or greater) such that there is a minimal decrease in capacitance (due to series capacitance effect) because of its addition; (iii) it may dissociate, at least partially, to provide a supply of p-type dopants in the near interfacial layer to ensure p-type behavior of the near interfacial electrode material; (iv) it can prevent outdiffusion of atoms from the dielectric 20 into the conductor 24; (v) it can prevent later oxidation under the conductor 24; and (vi) it modifies the areal density of electrical charge in the blanket layer 20.

The insulating interlayer 22 of the present invention is a chemical interlayer that prevents interaction between the gate dielectric 20 and the conductor 24. The interlayer 22 of the present invention is substantially non-reactive (there may be slight or partial decomposition, such as when its acts as a dopant source) with the underlying dielectric 20 therefore it does not react with the dielectric 20 forming a silicide. Another characteristic feature of the inventive insulating interlayer 22 is that silicon cannot reduce the inventive insulating interlayer 22. In cases in which some dissociation of the inventive interlayer 22 may occur, the inventive interlayer 22 should be either a p-type dopant or a neutral dopant so that device performance is not adversely affected. Also, the insulating interlayer 22 employed in the present invention should be a refractory compound that is able to withstand high temperatures (of approximately 1000° C., typical of standard CMOS processing).

Insulating materials that fit the above-mentioned criteria and are thus employed as the insulating interlayer 22 of the present invention include any insulating metal nitride that may optional include oxygen therein. Examples of insulating interlayers include, but are not limited to: aluminum nitride (AlN), aluminum oxynitride ($AlO_xN_y$), boron nitride (BN), boron oxynitride ($BO_xN_y$), gallium nitride (GaN), gallium oxynitride (GaON), indium nitride (InN), indium oxynitride (InON) and combinations thereof. In one preferred embodiment of the present invention, the insulating interlayer 22 is AlN or $AlO_xN_y$.

The insulating interlayer 22 is a thin layer that typically has a thickness from about 1 to about 25 Å, with a thickness from about 2 to about 15 Å being more typical.

The insulating interlayer 22 can be formed by various deposition processes such as, for example, chemical vapor deposition (CVD), plasma-assisted CVD, atomic layer deposition (ALD) using aluminum and nitrogen-based precursors, physical vapor deposition or molecular beam deposition where the metal is evaporated along with a beam or ambient of atomic or molecular nitrogen (that may be optionally an excited species) and optionally oxygen, metalorganic chemical vapor deposition (MOCVD), atomic layer deposition, sputtering, and the like. Alternatively, the insulating interlayer 22 can be formed by thermal nitridation or oxynitridation of a previously deposited insulating metal layer. Alternatively, the oxynitride of the metal may be created by first depositing the metal nitride, followed by partial oxidation in a suitable oxygen environment to create an oxynitride. Alternatively, the oxynitride of the metal may be created by first depositing the metal oxide, followed by partial nitridation in a suitable nitrogen environment to create an oxynitride.

One preferred method of forming the interlayer insulating layer 22 is by evaporating, under a high vacuum, Al from a standard Al effusion cell that is resistively heated, and using a nitrogen, or oxygen and nitrogen beams from commercial radio frequency (RF) atomic nitrogen or nitrogen and oxygen sources. For deposition of the nitride alone, a single RE nitrogen source suffices. For the oxynitride, a second RF source of oxygen may be used. Alternatively, the oxygen may be delivered simply as a molecular beam without an RF source. The process of evaporating under a high vacuum is described, for example, in U.S. Pat. No. 6,541,079, the entire content of which is incorporated herein by reference. The effusion cell typically has a temperature from about 1000° C.-1200° C. during the evaporation process. The evaporation process is typically performed using a RF source having a power from about 200-450 W and a flow rate from about 1-3 sccm. These numbers can also be widely varied from the stated bounds without problems. The substrate temperature is typically kept between 150° C. to 650° C. during deposition. Again, the deposition temperature can also be varied outside the stated ranges. Base vacuum chamber pressure is typically about $5\times10^{-10}$ to $2\times10^{-9}$ torr.

Notwithstanding the technique employed in forming the same, the insulating interlayer 22 formed in the present invention preferably is a continuous and uniform layer that is present atop the dielectric 20. By "continuous", it is meant that the insulating interlayer 22 contains no substantial breaks and/or voids therein; by "uniform" it is meant that the insulating interlayer 22 has nearly the same, as deposited, thickness across the structure. The insulating interlayer 22 may be amorphous meaning that it can lack a specific crystal structure. The insulating interlayer 22 may exist in other phases besides amorphous depending on the material used as well as the technique that is used in forming the same.

After forming the insulating interlayer 22, a blanket layer of a Si- or Ge-containing material 24 which becomes the Si- or Ge-containing conductor is formed on the insulating interlayer 22 utilizing a known deposition process such as, for example, physical vapor deposition, CVD or evaporation. The Si- or Ge-containing material 24 used in forming the conductor includes Si or a SiGe alloy layer in either single crystal, polycrystalline or amorphous form. Combinations of the aforementioned Si- or Ge-containing materials are also contemplated herein. The present invention also contemplates that the gate conductor can be a partial silicide or a fully silicide layer. The blanket layer of Si- or Ge-containing material 24 may be doped or undoped. If doped, an in-situ doping deposition process may be employed in forming the same. Alternatively, a doped Si- or Ge-containing layer can be formed by deposition, ion implantation and annealing.

The doping of the Si- or Ge-containing layer will shift the workfunction of the gate conductor formed. Illustrative examples of dopant ions include As, P, B, Sb, Bi, In, Al, Ga, or mixtures thereof. The thickness, i.e., height, of the Si- or Ge-containing layer 24 deposited at this point of the present invention may vary depending on the deposition process employed. Typically, the Si- or Ge-containing layer 24 has a vertical thickness from about 20 to about 180 nm, with a thickness from about 40 to about 150 nm being more typical.

In accordance with the present invention, the insulating interlayer 22 shows particular improvement in threshold voltage and flatband voltage stabilization when pFETs are formed. A pFET includes poly-Si that is doped with a p-type dopant such as boron.

After deposition of the blanket layer of Si- or Ge-containing material 24, a dielectric cap layer (not shown) can be formed atop the blanket layer of Si- or Ge-containing material 24 utilizing a deposition process such as, for example, physical vapor deposition or chemical vapor deposition. The dielectric cap layer may be an oxide, nitride, oxynitride or any combination thereof. The thickness, i.e., height, of the dielectric cap layer is from about 20 to about 180 nm, with a thickness from about 30 to about 140 nm being more typical.

Figure 2B:
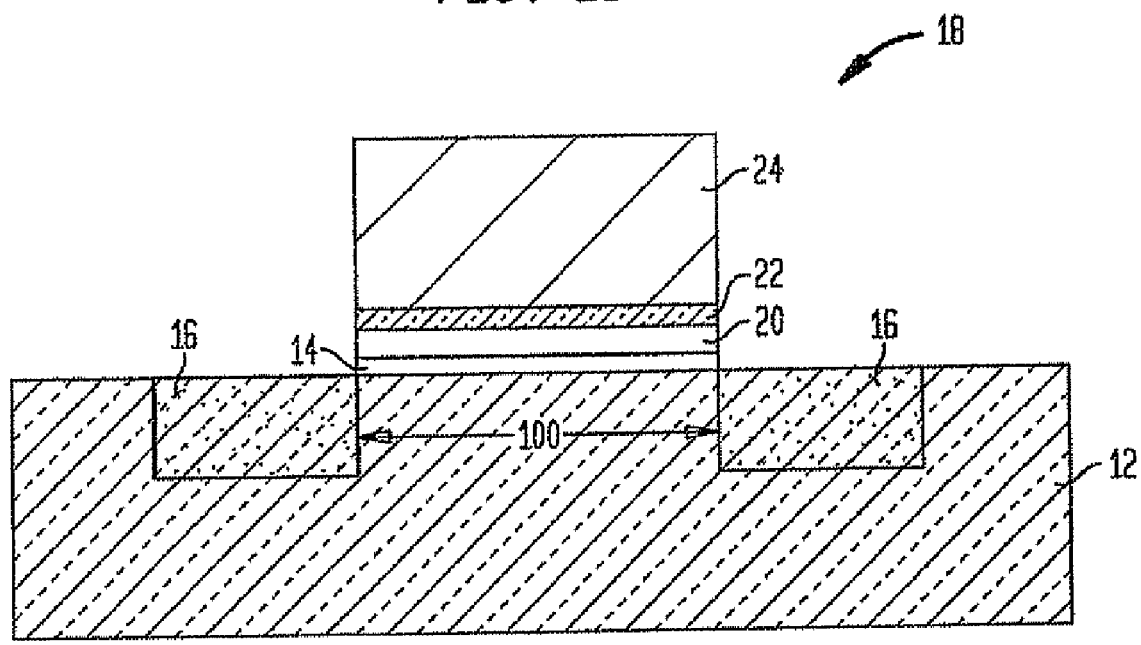

The dielectric cap (if present), the blanket Si-containing layer 24, and optionally the insulating interlayer 22 and the gate dielectric 20 may then be patterned by lithography and etching so as to provide a patterned material stack 18, See. FIG. 2B. The patterning and etching steps are optionally employed depending on the type of semiconductor device to be fabricated.

When a plurality of patterned material stacks are formed, the material stacks may have the same dimension, i.e., length, or they can have variable dimensions to improve device performance. The lithography step includes applying a photoresist to the upper surface of the blanket layered structure, exposing the photoresist to a desired pattern of radiation and developing the exposed photoresist utilizing a conventional resist developer. The pattern in the photoresist is then transferred to the structure utilizing one or more dry etching steps. In some embodiments, the patterned photoresist may be removed after the pattern has been transferred into one of the layers of the blanket layered structure. In other embodiments, the patterned photoresist is removed after etching has been completed.

Suitable dry etching processes that can be used in the present invention in forming the patterned material stacks include, but are not limited to: reactive ion etching, ion beam etching, plasma etching or laser ablation. The dry etching process employed is typically, but not always, selective to the underlying dielectric 20 therefore this etching step does not typically remove the dielectric 20. In some embodiments, this etching step may however be used to remove portions of the dielectric 20 that are not protected by the material layers of the material stack that were previously etched.

In some embodiments of the present invention, it is desirable to form pFETs that include the insulating interlayer and nFETs that do not include the same. In this embodiment of the present invention, the processing details described in U.S. patent Ser. No. 10/863,830, filed Jun. 4, 2004, the entire contents of which are incorporated herein by reference, are employed. In general terms, this embodiment can be realized by first providing a semiconductor substrate having a first device region and a second device region. Next, a dielectric stack including at least the dielectric and the interlayer insulator layer is formed atop each of the device regions. The insulating interlayer is then removed from one of the device regions utilizing a block mask over one of the device regions and etching the exposed interlayer insulator layer from the other device region. Next, the Si-containing material is formed in both device regions and etching is then performed to provide patterned nFETs and patterned pFETs.

Next, and at least one spacer (not shown) is typically, but not always, formed on exposed sidewalls of each patterned material stack; this step is applicable for FET and MOS capacitor fabrication. The at least one spacer is comprised of an insulator such as an oxide, nitride, oxynitride and/or any combination thereof. The at least one spacer is formed by deposition and etching.

The width of the at least one spacer must be sufficiently wide such that the source and drain silicide contacts (to be subsequently formed for FET devices) do not encroach underneath the edges of the gate stack. Typically, the source/drain silicide does not encroach underneath the edges of the gate stack when the at least one spacer has a width, as measured at the bottom, from about 20 to about 80 nm.

The material stack 18 can also be passivated at this point of the present invention by subjecting the same to a thermal oxidation, nitridation or oxynitridation process. The passivation step forms a thin layer of passivating material about the material stack. This step may be used instead or in conjunction with the previous step of spacer formation. When used with the spacer formation step, spacer formation occurs after the material stack passivation process.

Source/drain diffusion regions 16 (with or without the spacers present) are then formed into the substrate. The source/drain diffusion regions 16 are formed utilizing ion implantation and an annealing step. The annealing step serves to activate the dopants that were implanted by the previous implant step. The conditions for the ion implantation and annealing are well known to those skilled in the art.

The source/drain diffusion regions 16 may also include extension implant regions which are formed prior to source/drain implantation using a conventional extension implant. The extension implant may be followed by an activation anneal, or alternatively the dopants implanted during the extension implant and the source/drain implant can be activated using the same activation anneal cycle. The region of the semiconductor substrate between the source/drain regions that lies beneath each of the patterned gate regions 18 is the device channel 100.

Next, and if not previously removed, the exposed portion of the dielectric 20 is removed utilizing a chemical etching process that selectively removes the dielectric 20. This etching step stops on an upper surface of the semiconductor substrate 12. Although any chemical etchant may be used in removing the exposed portions of the dielectric 20, in one embodiment dilute hydrofluoric acid (DHF) is used.

Further CMOS processing such as formation of silicided contacts (source/drain and gate) as well as formation of BEOL (back-end-of-the-line) interconnect levels with metal interconnects can be formed utilizing processing steps that are well known to those skilled in the art.

Figure 3:
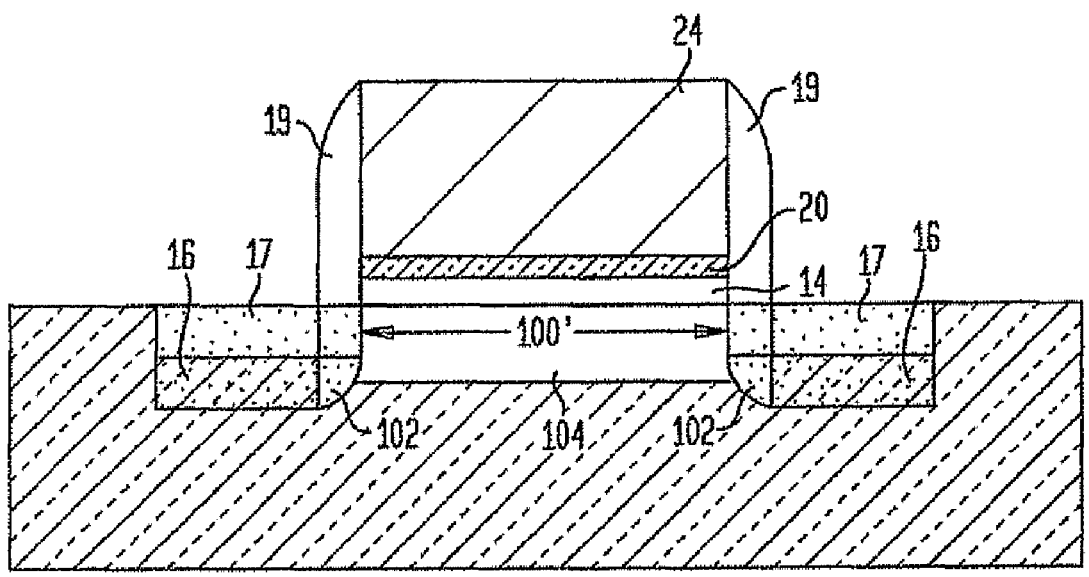
FIG. 3 is a pictorial representation (through a cross sectional view) of the inventive semiconductor structure that includes an engineered channel region and a high k dielectric with a high content of Si or Ge.
Figure 4:
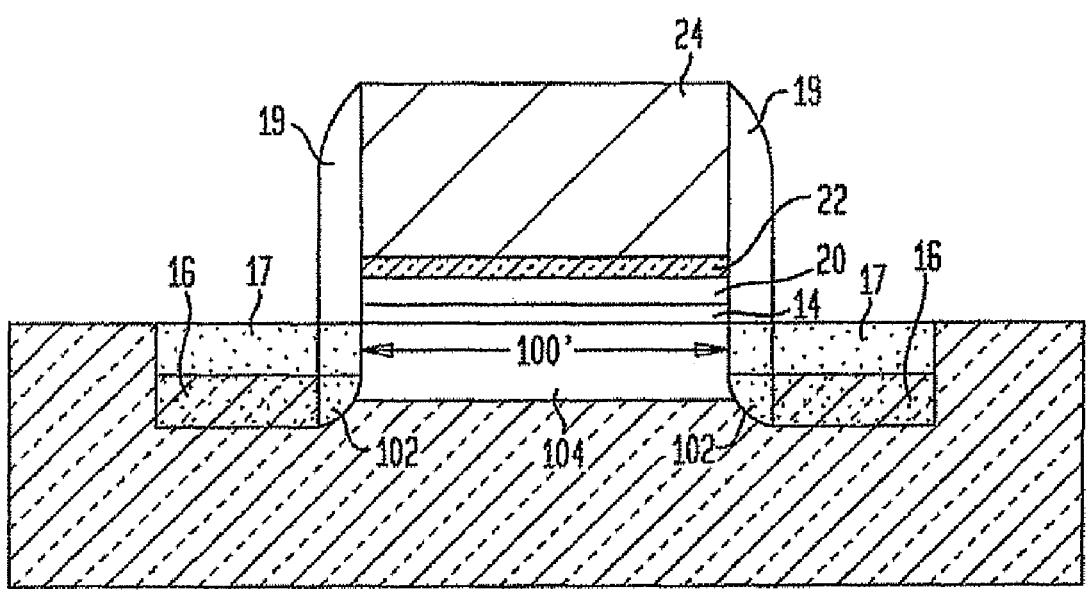
FIG. 4 is a pictorial representation (through a cross sectional view) of the inventive semiconductor structure that includes an engineered channel region, an insulating interlayer and a high k dielectric with a high content of Si or Ge.

In another embodiment of the present invention, the dielectric 20 described above is used in conjunction with a channel region 100' that has been engineered by counterdoping or halo implant tuning, or by a combination of counterdoping and halo implant tuning. The structure including the dielectric 20 and the engineered channel region 100' is shown in FIG. 3. FIG. 4 shows an embodiment of the present invention wherein the dielectric 20, the insulating interlayer 22 and the engineered channel region 100' are implemented. In both these structures, threshold voltage and flatband voltage are stabilized. Note also that source/drain extension regions 17 and spacer 19 are also shown as well as the halo region 102 and the counterdopant region 104.

The halo regions 102 are formed by implanting a halo ion into the surface of a semiconductor substrate 12 including the patterned gate region 18 shown in FIG. 1B before source/drain diffusion ion implantation. The halo implant is shown in FIGS. 3 and 4 by reference numeral 102. The halo implant is performed at an energy, halo ion concentration, and angle which are adjusted to provide for further tuning of the threshold/flatband shift observed in a particularly gate stack. The exact conditions of the halo implant may vary depending on the degree of threshold/flatband voltage tuning necessary. Typical conditions include: a halo implant energy from about 5 to about 100 keV, a halo ion areal density from about $5\times10^{12}$ to about $2\times10^{14}$ atoms/cm$^2$ and an implant angle from about 10° to about 45°.

The counterdoped region 104, is located within the engineered channel region 100' near the top of the semiconductor substrate 12, typically within the top 10 to 100 Å of the semiconductor substrate 12. The counterdoped region 104 is formed either before the multilayered stack is formed or after gate stack formation. The counterdoped region 104 is formed by supplying dopants of opposite type to those used for channel doping. The counterdoped region 104 can be formed by ion implantation and anneal. Typical ion implant conditions include: an energy from about 1 to 3 keV, and a dopant concentration from about $10^{17}$ to $10^{19}$ atoms/cm$^3$. Alternatively, a material containing the counterdopant ion can be provided either as a separate layer or as one of the components of the gate stack and annealing can be used to cause diffusion of the ions into the substrate.

It is emphasized that each of the embodiments of the present invention described above provides sufficient threshold/flatband voltage control which renders implementation of such structures into functional circuitry a possibility.

The above embodiments are given to illustrate the scope and spirit of the present invention. These embodiments will make apparent, to those skilled in the art, other embodiments. Those other embodiments are within the contemplation of the present invention. Therefore, the present invention should be limited only by appended claims.

What is claimed is:

1. A method of forming a semiconductor structure having improved threshold voltage and flatband voltage stability comprising:
   providing a structure on a semiconductor substrate, said structure comprising a gate stack including a high k gate dielectric having Ge content greater than 50 atomic % and a Si- or Ge-containing gate conductor, and at least one element selected from an insulating interlayer located between said high k gate dielectric and said gate conductor, a device channel including a tuned halo implant region or a counterdoped region, and a combination thereof; and
   applying a bias to said gate stack.

2. The method of claim 1 wherein said high k gate dielectric is a metal germanate or a nitride metal germanate.

3. The method of claim 2 wherein said high k gate dielectric is a Hf-based material.

4. The method of claim 1 wherein said at least one element is the insulating interlayer.

5. The method of claim 4 wherein said insulating interlayer is an insulating metal nitride or an insulating material including a metal, oxygen, and nitrogen.

6. The method of claim 1 wherein said at least one element is the device channel.

7. The method of claim 1 wherein said high k gate dielectric is a Hf-based dielectric and said at least one element is an AlN or $AlO_xN_y$ insulating interlayer.

8. The method of claim 1 wherein said high k gate dielectric comprises at least a metal, germanium, and N.

9. The method of claim 1 wherein said high k gate dielectric comprises at least a metal other than Al, germanium, and Al.

10. The method of claim 1 wherein said at least one element is an insulating layer comprising $AlO_xN_y$.

11. The method of claim 1 wherein said at least one element is an insulating layer comprising a material selected from BN, $BO_xN_y$, GaN, GaON, InN, and InON.

12. A method of forming a semiconductor structure having improved threshold voltage and flatband voltage stability comprising:

provided a structure on a semiconductor substrate, said structure comprising a gate stack including a high k gate dielectric having a Ge content of greater than 50 atomic % and a Si- or Ge-containing gate conductor, and at least one element selected from an insulating interlayer located between said high k gate dielectric and said gate conductor, a device channel including a tuned halo implant region or a counterdoped region, and a combination thereof, wherein said high k gate dielectric includes aluminum, or a metal other than aluminum; and applying a bias to said gate stack.

13. The method of claim 12 wherein said at least one element is the insulating interlayer, wherein said insulating interlayer is an insulating metal nitride or an insulating material including a metal, oxygen, and nitrogen.

14. The method of claim 12 wherein said at least one element is an insulating layer comprising AlN or $AlO_xN_y$.

15. The method of claim 14 wherein said insulating layer comprises $AlO_xN_y$.

16. The method of claim 12 wherein said at least one element is an insulating layer comprising a material selected from BN, $BO_xN_y$, GaN, GaON, InN, and InON.

17. A method of forming a semiconductor structure having improved threshold voltage and flatband voltage stability comprising:

providing a structure on a semiconductor substrate, said structure comprising a gate stack including a high k gate dielectric having a Ge content of greater than 50 atomic % and a Si- or Ge-containing gate conductor, and at least one element selected from an insulating interlayer located between said high k gate dielectric and said gate conductor, a device channel including a tuned halo implant region or a counterdoped region, and a combination thereof, wherein said high k gate dielectric includes a metal and nitrogen; and applying a bias to said gate stack.

18. The method of claim 17 wherein said at least one element is the insulating interlayer, wherein said insulating interlayer is an insulating metal nitride or an insulating material including a metal, oxygen, and nitrogen.

19. The method of claim 18 wherein said insulating layer comprises $AlO_xN_y$.

20. The method of claim 17 wherein said at least one element is an insulating layer comprising a material selected from BN, $BO_xN_y$, GaN, GaON, InN, and InON.

* * * * *